(12) United States Patent
Chou et al.

(10) Patent No.: US 8,662,929 B2
(45) Date of Patent: Mar. 4, 2014

(54) THUMB DRIVE CHASSIS STRUCTURE

(71) Applicants: Peter Lee Kuo Chou, Orange, CA (US); Shing Kuo Tarn, Cerritos, CA (US); John Pei Ho, Trabuco Canyon, CA (US)

(72) Inventors: Peter Lee Kuo Chou, Orange, CA (US); Shing Kuo Tarn, Cerritos, CA (US); John Pei Ho, Trabuco Canyon, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 0 days.

(21) Appl. No.: 13/720,537

(22) Filed: Dec. 19, 2012

(65) Prior Publication Data

US 2013/0109235 A1 May 2, 2013

Related U.S. Application Data

(63) Continuation of application No. 13/004,105, filed on Jan. 11, 2011, now Pat. No. 8,360,809.

(60) Provisional application No. 61/397,173, filed on Jun. 7, 2010.

(51) Int. Cl.
*H01R 13/00* (2006.01)

(52) U.S. Cl.
USPC .................................................... 439/620.21

(58) Field of Classification Search
USPC ............................................ 439/76.1, 620.21
See application file for complete search history.

(56) References Cited

U.S. PATENT DOCUMENTS

| | | | |
|---|---|---|---|
| 6,778,401 B1 | 8/2004 | Yu et al. |
| 7,407,390 B1 | 8/2008 | Ni |
| 7,422,454 B1 | 9/2008 | Tang et al. |
| 7,524,198 B2 | 4/2009 | Nguyen et al. |
| 7,815,469 B1 | 10/2010 | Nguyen et al. |
| 7,824,227 B1 | 11/2010 | Lee et al. |
| 2007/0171620 A1 | 7/2007 | Lee |
| 2010/0091469 A1 | 4/2010 | Lin |

*Primary Examiner* — Briggitte R Hammond
(74) *Attorney, Agent, or Firm* — Law Offices of S.J. Christine Yang

(57) ABSTRACT

A thumb drive with a miniaturized memory storage assembly package that employs an extended chassis structure to support the miniaturized memory device within an ergonomically designed casing that is also simple to manufacture. The miniaturized memory storage assembly has a flexible latch projection extending from its side that mates with a complimentary latch aperture in the side of the connector housing. Downwardly projecting tongues in the top surface of the connector housing also prevent movement of the assembly within the housing. The elongated platform chassis extending rearwardly from the USB connector housing snaps in place in an ergonomically designed thumb drive case.

16 Claims, 9 Drawing Sheets

US 8,662,929 B2

THUMB DRIVE CHASSIS STRUCTURE

The present invention claims priority to provisional application no. 61/397,173 filed on Jun. 7, 2010 and to non-provisional utility application no. 13/004,105 filed on Jan. 11, 2011, which are incorporated in its entirety by reference.

BACKGROUND OF THE INVENTION

1. Field Of The Invention

The present invention relates generally to portable memory devices and, more specifically, to a USB thumb drive chassis adapted to support a System-in-Package ("SiP"), miniaturized flash drive configured to mate with an ergonomically-sized housing. The invention also discloses a method of manufacturing the same.

2. Discussion Of The Related Art

Portable memory storage devices, such as memory devices with USB connectors, are increasingly utilized to portably transfer electronic data. One type of the portable memory storage devices are commonly referred to as thumb drives, which have ergonomically-sized housing that could be easily handled in a user's hand.

FIG. 1A is a perspective view of a conventional thumb drive, and FIG. 1B is another perspective view of the conventional thumb drive shown in FIG. 1A. In FIG. 1A and 1B, a thumb drive 10 has a casing 12 formed of upper 13 lower 14 halves. At the forward end of the thumb drive 10, a male USB connector 11 projects out from the casing 12. As seen from FIG. 1B in which the upper 13 half of the casing 12 (shown in FIG. 1A) is lifted, a Printed Circuit Board Assembly ("PCBA") 15 is shown as exposed and is supported within the casing 12. The PCBA 15 stretches along most of the entire length of the casing 12. The PCBA 15 supports memory and controller chips and provides the circuitry connecting these chips as well as other components or electronics necessary for a portable memory device.

The male USB connector 11 at the forward end of the thumb drive 10 is electrically connected to the circuitry of the PCBA 15 by means of soldering and secured to the PCBA 15 by this soldering as well as other mechanical means known in the art. The male USB connector 11 is a male USB connector with electrical contacts built in a metallic casing with two apertures on an upper surface, dimensions of its electrical contacts, casing and apertures are governed by the USB standard.

The resulting thumb drive 10 can be connected to a USB port in a laptop computer, PC, peripheral device, or any other USB-compatible machine or device. The thumb drive 10 is small enough to fit easily in a user's pocket and is useful for portable storage of data. The casing 12 of the thumb drive 10 is a convenient size for a human hand. It is not so large that it is bulky, and it is not so small that it is hard to handle and use.

Recently, miniaturized memory assemblies have appeared which replace the conventional PCBAs. These new assemblies incorporate memory storage, controller, and other necessary circuitry in a very small package, sometimes referred to as "System-in-Package", or "SiP". A SiP device can be a complete functional unit by itself in one multi-chip package and include appropriate electrical connectors for connection. The size of these SiP devices could be customized but generally very small. For example, a SiP device could be no thicker than a penny and less than about an inch (2.5 cm) in length. SiP memory devices generally are not much larger than the conventional male USB connector necessary for connecting the device to the USB port of a laptop or similar machine. But, the small SiP memory devices can be awkward for a person to use and carry, because it is too small for easy handling by a human hand and it could be more easily lost than conventional thumb drives. It is not easy to incorporate these miniaturized SiP memory devices into a conventional thumb drive casing, because the conventional thumb drive casing cannot provide sufficient support to the SiP device to prevent it from pivoting at the mouth of the conventional plastic case, thereby breaking the case when the USB connector is inserted into a USB port.

Therefore, what is needed is a structure that can support a miniaturized memory device, such as a SiP memory device, so that is easier for the user to handle and less likely to be lost when carried. Also needed is an ergonomic thumb drive that can provide support to a miniaturized memory device, so that the miniaturized memory device will not pivot within its casing during insertion into a USB port. Also needed is a thumb drive that is simple and inexpensive to manufacture.

SUMMARY OF THE INVENTION

Accordingly, embodiments of the invention are directed to a chassis structure and a method of manufacturing the same that substantially obviate one or more of the problems due to limitations and disadvantages of the related art.

An object of embodiments of the invention is to provide a chassis structure and a method of manufacturing the same that provide support for a very small memory package, such as a "System-in-Package" or "SiP" memory device.

Another object of embodiments of the invention is to provide a thumb drive chassis structure and a method of manufacturing the same that hold a very small memory package, such as a "System-in-Package" or "SiP" memory device, and couple the memory package to a male USB connector for connection with a USB port in an ergonomic casing.

Another object of embodiments of the invention is to provide a thumb drive chassis structure and a method of manufacturing the same that hold a very small memory package, such as a "System-in-Package" or "SiP" memory device, and prevent pivoting at the mouth of the case and breaking the case when the USB connector is inserted into a USB port, and yet is inexpensive to manufacture.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, a device includes a casing, a connector housing, the connector housing including an opening at a first end and a stop wall partially cover the opening, and a memory package, the memory package including electrical contacts and the memory package being within the connector housing and abutted the stop wall of the connector housing, wherein a portion of the connector housing is within the casing, the opening at the first end of the connector housing is outside the casing, and the electrical contacts and the front opening of the connector housing form a connector.

In another aspect, a device includes a casing, a connector housing, the connector housing including an opening at a first end and a stop wall partially cover the opening, a memory package, the memory package including electrical contacts and the memory package being within the connector housing and abutted the stop wall of the connector housing, and a chassis, the chassis extending from a second end of the connector housing and along lengthwise of the casing, wherein a portion of the connector housing is within the casing, the opening at the first end of the connector housing is outside the casing, and the electrical contacts and the front opening of the connector housing form a connector.

In yet another aspect, a memory package device includes a package housing, the package housing enclosing at least a memory chip and a memory controller chip and electrical contacts exposed at one end of the package housing, wherein the memory package includes a raised portion at a second end of the package housing.

The present invention discloses a USB thumb drive with a miniaturized memory storage assembly, such as a SiP memory device, that employs an extended chassis structure to support the miniaturized memory device within an ergonomically designed casing. The present invention discloses a miniaturized memory device secured within a USB connector housing, and further discloses an elongated platform chassis extending rearwardly from the back end of the USB housing. The elongated platform chassis forms a support structure, so that the USB connector housing and chassis can be supported within a thumb drive casing that is long and thick enough to be ergonomically compatible with a human hand and with portability. The USB housing and chassis structure prevents the USB housing from pivoting within mouth of the ergonomic casing when a user inserts the USB connector into the USB port of a laptop computer or similar machine.

The present invention also discloses a miniaturized memory storage assembly, such as a SiP memory device, that is simple to manufacture. The miniaturized memory storage assembly is inserted into a USB connector housing, preferably through a rear opening. The miniaturized memory storage assembly has a ramped, flexible latch projection extending from its side. The USB connector housing has a complimentary latch aperture in its side. The flexible, ramped latch projection is pushed inward when the miniaturized memory storage assembly is inserted into the USB connector housing. When the miniaturized memory storage assembly is fully inserted into the USB connector housing, the flexible latch snaps outward through the complimentary latch aperture and restricts movement of the assembly within the housing by preventing the assembly from being pulled back out as well as preventing upward movement of the assembly within the housing. A stop at the front of the USB connector housing prevents the miniaturized memory storage assembly from being pushed forward. The top surface of the USB connector housing also includes stamped apertures that form downwardly projecting tongues. These tongues push down against the top surface of the miniaturized memory storage assembly and further prevent movement of the assembly within the housing. The elongated platform chassis extending rearwardly from the USB connector housing snaps in place in an ergonomically designed thumb drive case. In one embodiment, the plastic case is formed of lower and upper halves. The elongated platform chassis snaps in place in the lower half of the case. Latches in the lower case snap into notches in the chassis. The upper half of the case is then fixed to the lower half by adhesive or friction welding.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION OF THE PREFERRED EMBODIMENTS

Reference will now be made in detail to the preferred embodiments of the invention, examples of which are illustrated in the accompanying drawings.

Figure 1B:
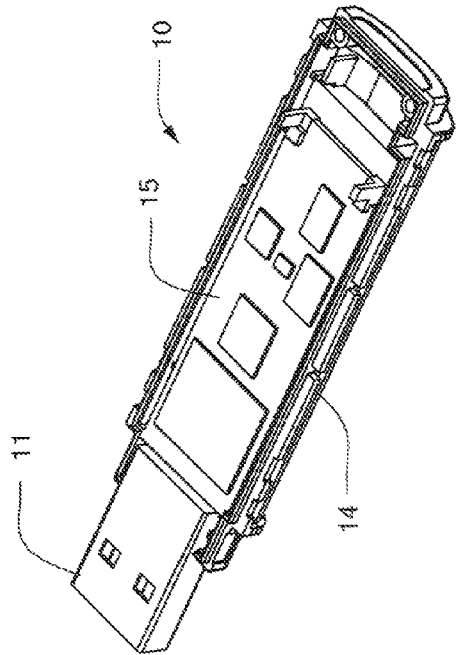
FIG. 1B is another perspective view of the conventional thumb drive shown in FIG. 1A.
Figure 1A:
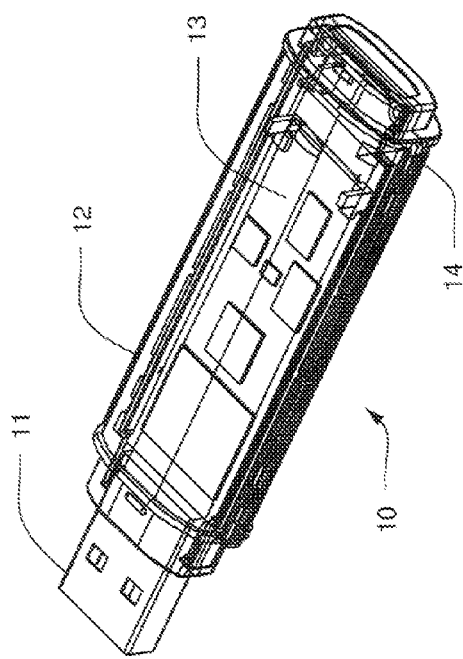
FIG. 1A is a perspective view of a conventional thumb drive.
Figure 2:
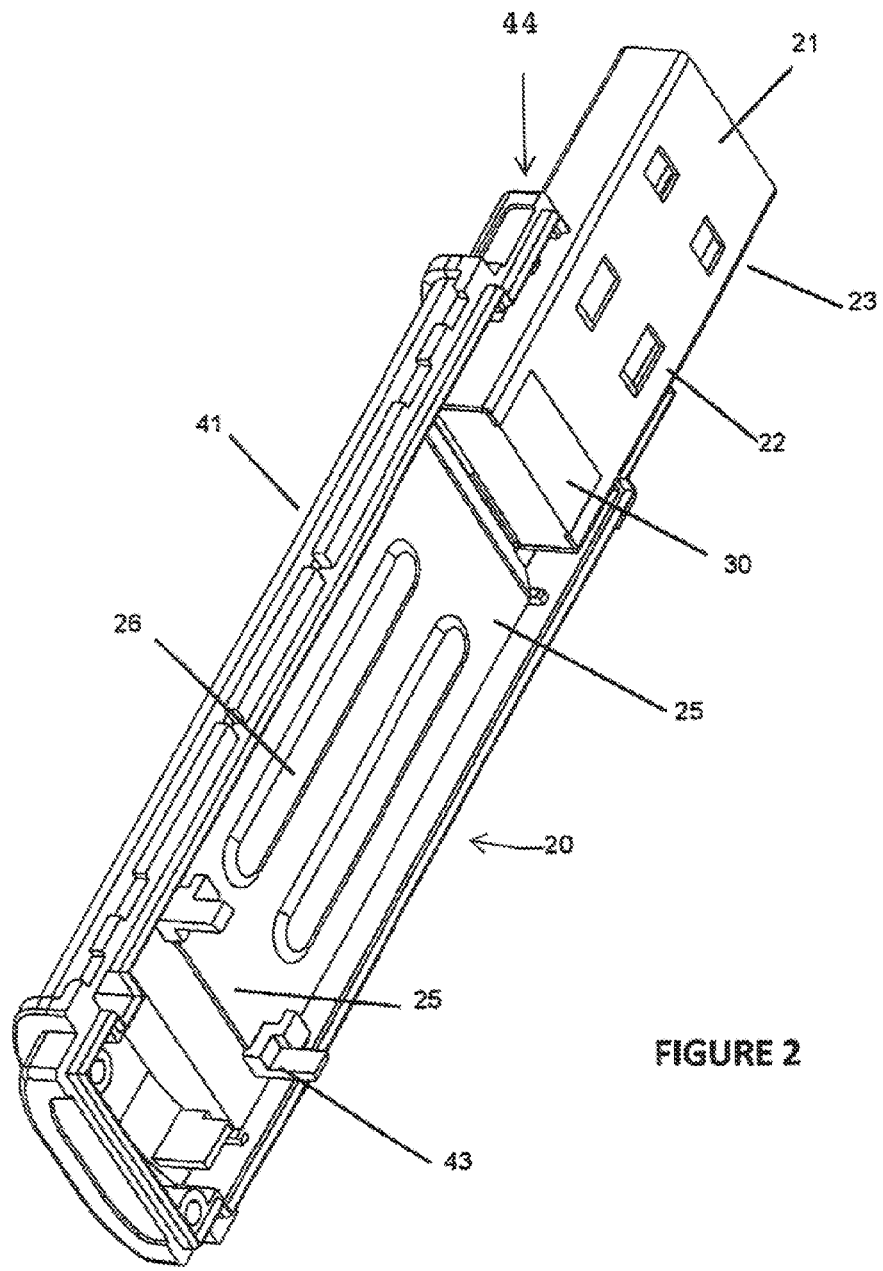
FIG. 2 is a perspective view of a thumb drive according to an embodiment of the present invention.

FIG. 2 is a perspective view of a thumb drive according to an embodiment of the present invention. In FIG. 2, a thumb drive 20 includes a lower casing half 41 and an upper casing half 42 (shown in FIG. 5). The lower and upper casing halves 41 and 42 when assembled together form a mouth 44 at one end. The lower casing half 41 supports a portion of a USB connector housing 22 at the mouth of the casing 44, and supports a platform chassis extension 25 extending rearwardly from the USB connector housing 22.

The lower casing half 41 includes stop structures 43 at the rear portion of the lower casing half 41 to provide positive mechanical fixture to the platform chassis extension 25. Notches 29 (shown in FIG. 3) at the rear end 28 of the platform chassis extension 25 mate with the notches 29 in the lower casing half 41. Strengthening ribs 26 in the platform chassis extension 25 provide additional mechanical strength to the chassis.

The USB connector housing 22 holds a miniaturized memory storage assembly, such as the SiP memory device 30 shown. The USB connector housing 22 and SiP memory device 30 form a miniaturized memory storage assembly 23, or SiP assembly, as it will be referred to hereafter. When the SiP memory device 30 is in the USB connector housing 22, the front of the USB connector housing 22 forms the male USB connector 21 for mating with a female USB port (not shown) of a laptop or other machine device designed to receive a USB connector.

Figure 3:
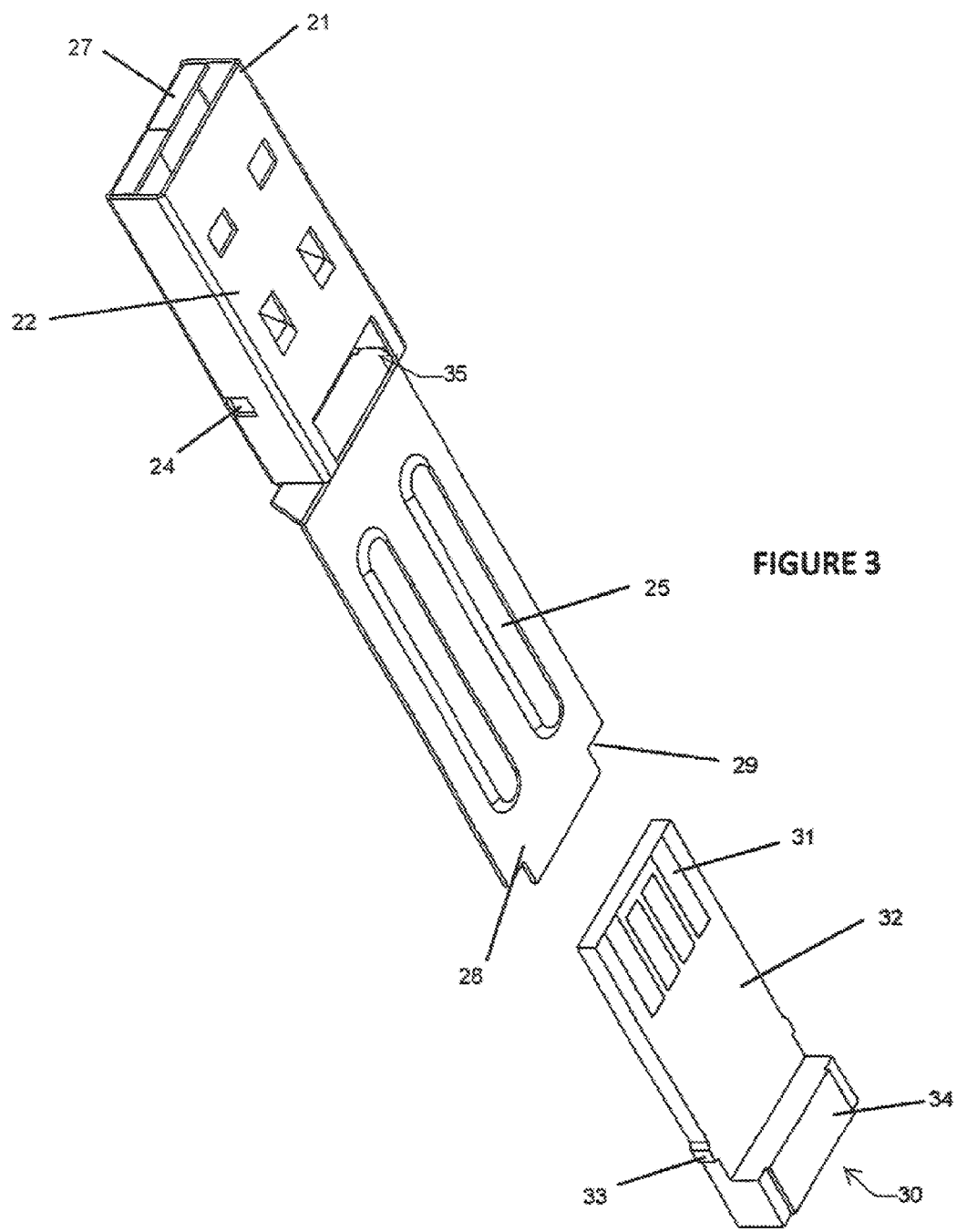
FIG. 3 is a perspective, exploded view of the SiP memory device and the USB connector housing and platform chassis extension according to an embodiment of the present invention.
Figure 4:
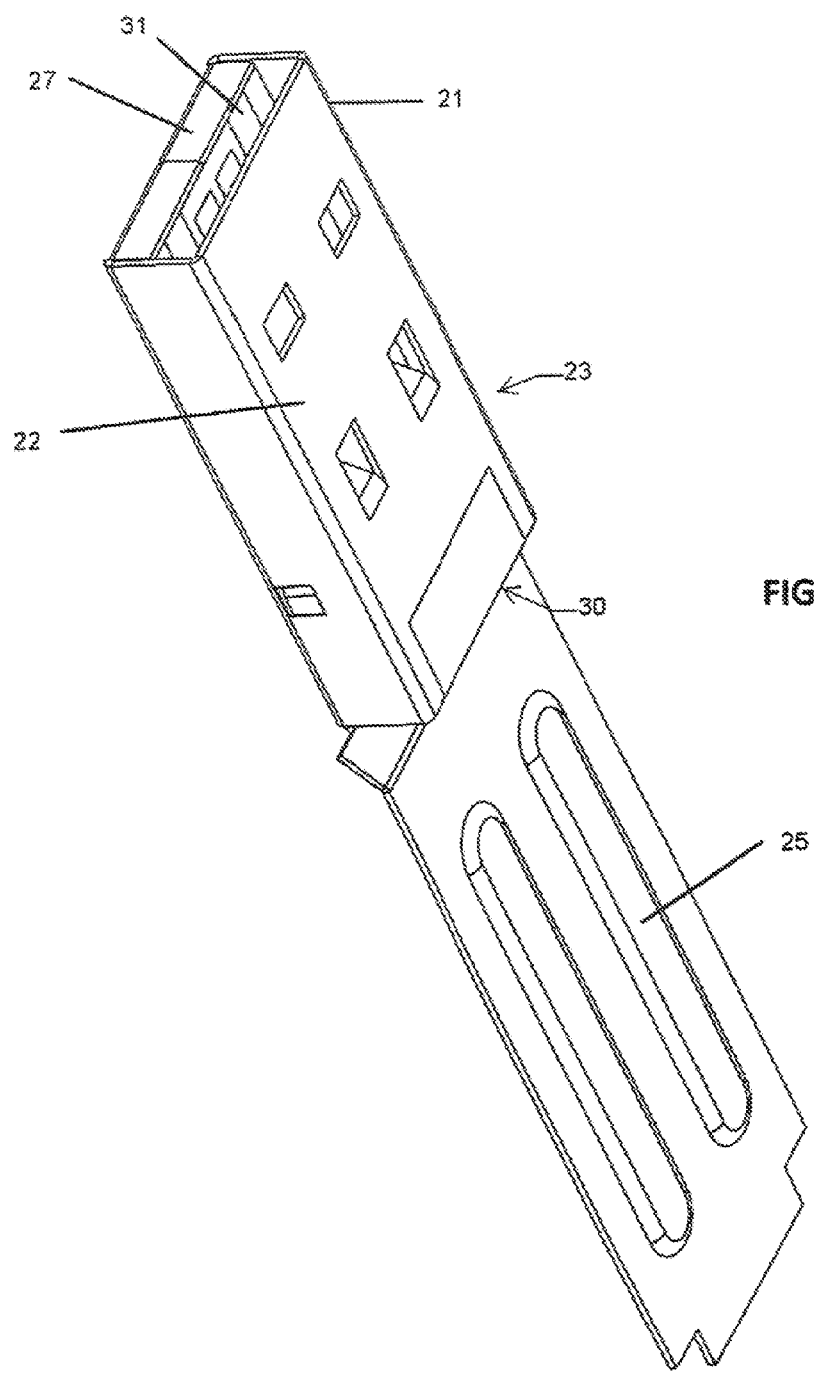
FIG. 4 is a perspective view of the SiP memory device secured in the USB connector housing and the platform chassis extension shown in FIG. 3.

FIG. 3 is a perspective, exploded view of the SiP memory device and the USB connector housing and platform chassis extension according to an embodiment of the present invention, and FIG. 4 is a perspective view of the SiP memory device secured in the USB connector housing and the platform chassis extension shown in FIG. 3. FIGS. 3 and 4 show the assembly of the USB connector housing 22 and the SiP memory device 30. The male connector end of the USB connector housing 22 forms an opening, the dimensions of which are governed by the USB standard. The lower portion of the opening includes a stop wall 27, which prevents the SiP memory device 30 from being pushed past the front opening. Alternatively, or in addition to the stop wall 27, the SiP memory device 30 can include a raised portion 34 at the rear of the SiP memory device 30, and the USB connector housing 22 can include a cut-out 35 to receive the raised rear portion 34, thereby preventing the SiP memory device 30 from being pushed forward in the USB connector housing 22.

On the top surface 32 of the forward end of the SiP memory device 30 are four electrical conductors 31, the dimensions of which are governed by the USB standard. Extending from each side of the SiP memory device 30 are flexible, ramped latch projections 33. At a complimentary position on each side of the USB connector housing 22 are latch openings 24. The latch openings 24 are adjacent the bottom of the sides of the USB connector housing 22. As shown in FIG. 3, the SiP memory device 30 is inserted into the rear opening of the USB connector housing 22. When the SiP memory device 30 is inserted, the flexible, ramped latch projections 33 are forced inward until they reach the latch openings 24 in the sides of the USB connector housing 22, at which point the latch projections 33 snap out and latch the SiP memory device 30 in place.

Figure 8A:
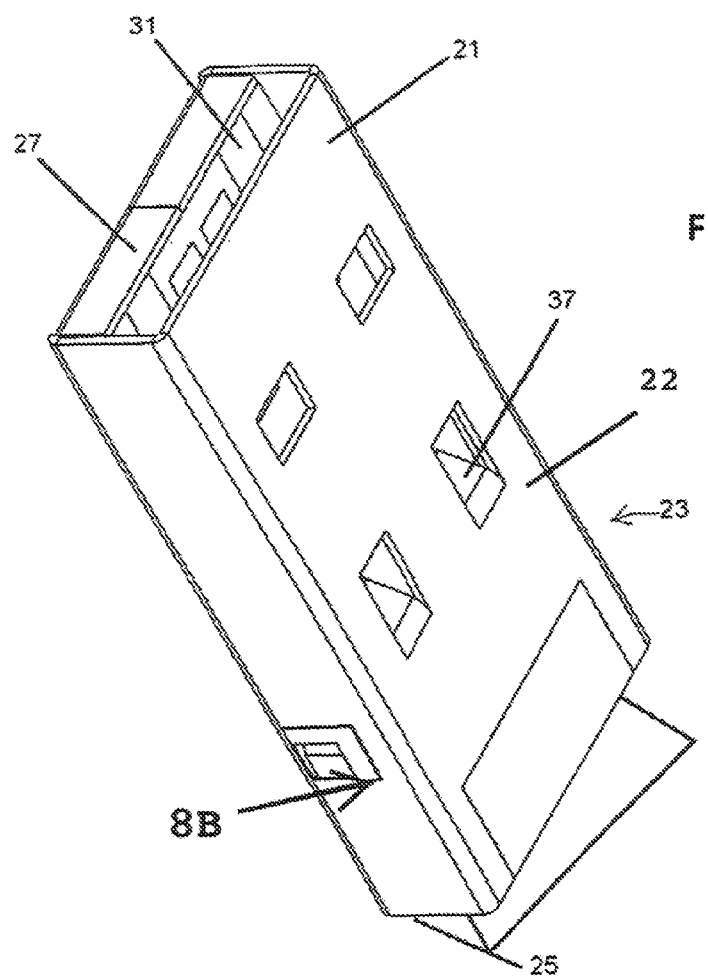
FIG. 8A is a perspective view of the SiP memory device secured within the forward portion of the USB connector housing according to an embodiment of the present invention.
Figure 8B:
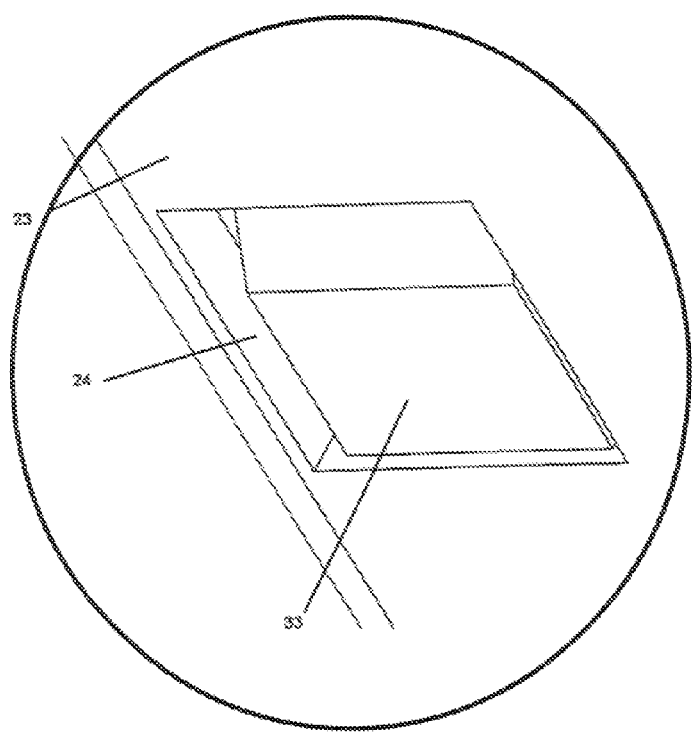
FIG. 8B is a detailed view of a portion of the USB connector housing and SiP memory device shown in FIG. 8A.

As shown in detail in FIG. 8B, the rear and upper portions of the latch projections 33 are not ramped, but straight, and prevent the SiP memory device 30 from being pulled back out of the USB connector housing 22 or lifted up within the USB connector housing 22. As described above, the stop wall 27 at the front of the male USB connector 21 opening, and/or the raised portion 34 of the SiP memory device 30 and the cut-out 35 in the USB connector housing 22, prevent the SiP memory device 30 from being pushed out of the USB connector housing 22. The combined USB connector housing 22 and SiP memory device 30 form the SiP assembly 23.

Figure 5:
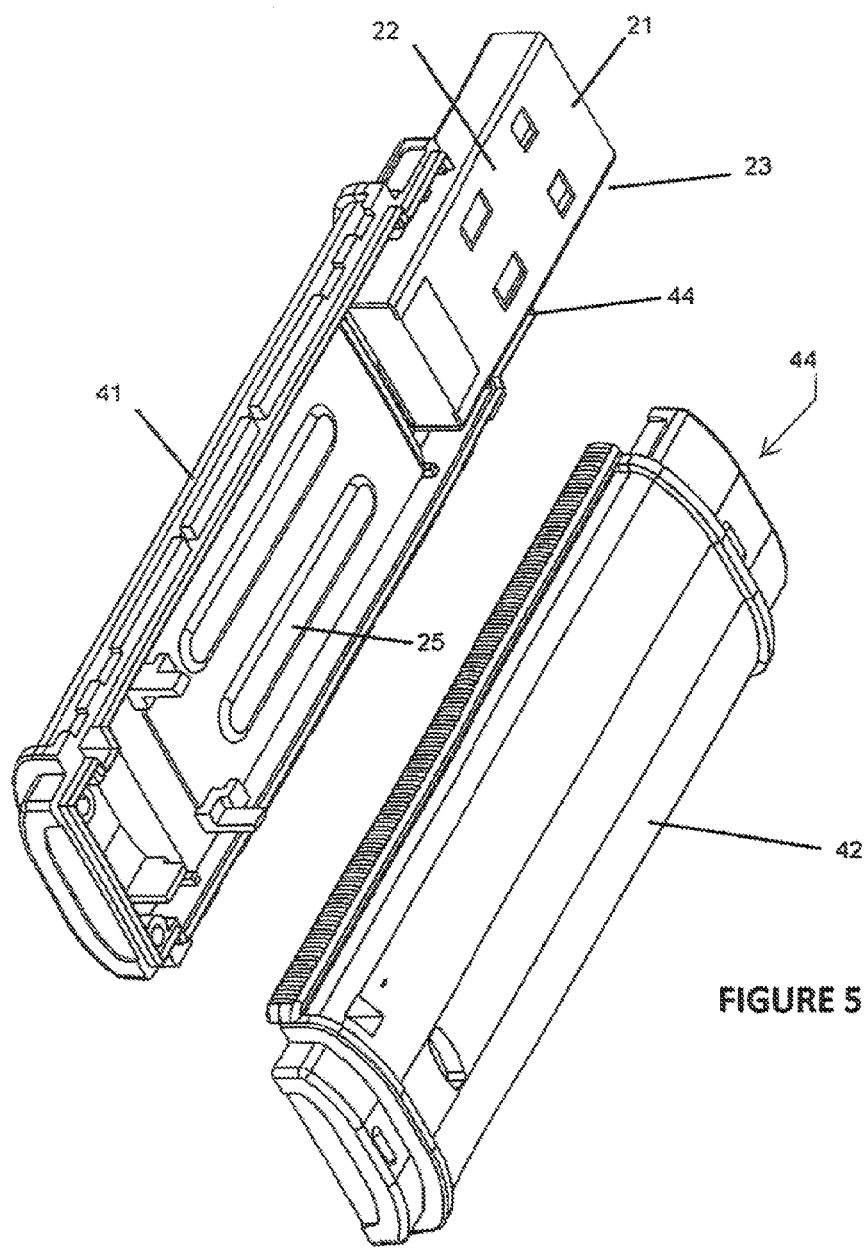
FIG. 5 is a perspective, exploded view of the lower half of the casing supporting a SiP memory device mounted in a USB connector housing with the platform chassis extension, as well as the upper half of the casing according to an embodiment of the present invention.

FIG. 4 shows the assembled SiP assembly 23 and platform chassis extension 25. FIG. 5 shows how the upper casing half 42 is placed onto the lower casing half 41, SiP assembly 23, and platform chassis extension 25. The platform chassis extension 25 projects rearwardly from the SiP assembly 23. The platform chassis extension 25 includes an inclined portion that directly extends from the USB connector housing 22 and a substantially planar portion that extends rearwardly along the lengthwise of the casing 40.

Figure 6:
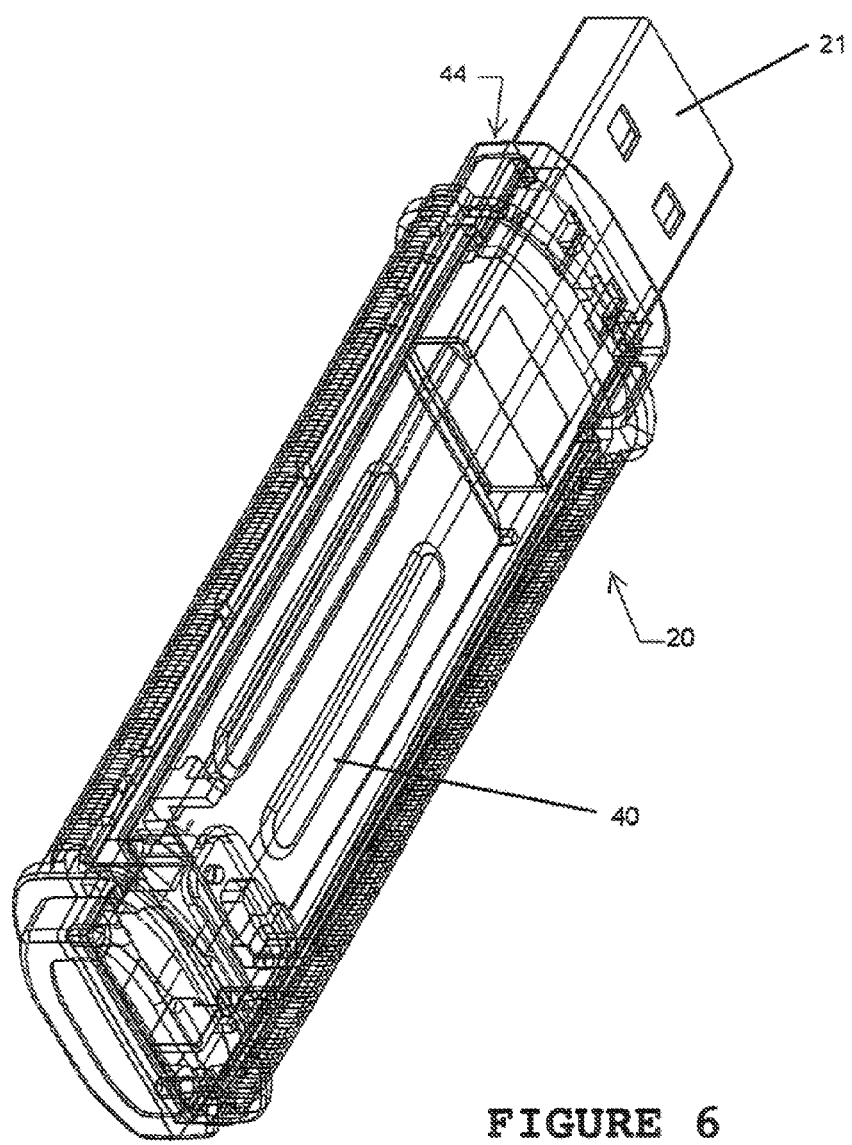
FIG. 6 is a perspective view of the complete USB thumb drive with both halves of the casing (shown in ghost) covering a portion of the USB connector housing and all of the platform chassis extension according to an embodiment of the present invention.

It will be appreciated that the elongated platform chassis extension, which is part of the metal USB connector housing structure 22, provides substantial support to the SiP assembly 23 and will prevent it from pivoting in the mouth 44 of the casing 40 when the male USB connector 21 is inserted into a female USB port (not shown). Users do not always exercise care when inserting a USB thumb drive into a USB port, and the resulting action of pushing a male connector can exert significant force. Without the platform chassis extension 25 according to an embodiment of the present invention, it would be easy to pivot a miniaturized USB connector and memory storage device within the mouth of an elongated, ergonomic plastic casing. The completed thumb drive 20 of the present invention is shown in FIG. 6. The casing 40 is long and thick enough to be ergonomically compatible with a human hand and, at the same time, small enough to be compatible with portability. The male USB connector 21 projects from the mouth 44 of the thumb drive 20. The male USB connector 21 can be protected with a cap (not shown), or the assembly of the present invention is readily compatible with retractable mechanisms, such as the one shown in U.S. Pat. No. 7,422,454 to Tang et al.

Figure 7:
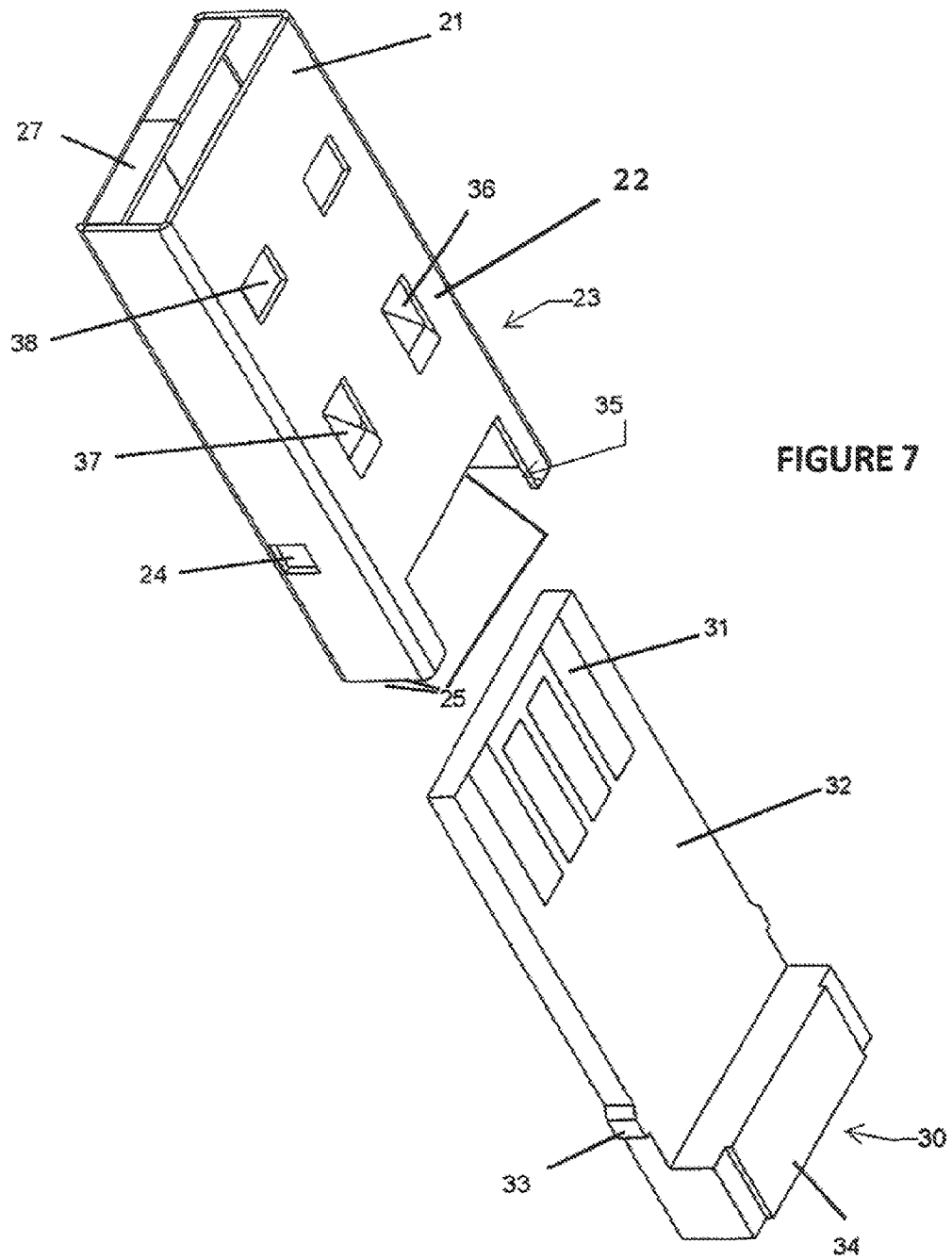
FIG. 7 is a perspective, exploded view of a portion of the USB connector housing and the SiP memory device according to an embodiment of the present invention.

Referring now to FIGS. 7 and 8A, additional detail of the SiP assembly is shown. FIG. 7 shows the SiP memory device 30 being inserted into the rear opening of the USB connector housing 22. On the top surface of the USB connector housing 22 are a pair of apertures 36 located at about the mid-way point of the housing, behind the USB apertures 38. The dimensions and positions of the USB apertures 38 are dictated by the USB standard. The apertures 36 may be formed by stamping. The USB connector housing 22 is formed of metal and the stamping of the apertures 36 can leave the rearmost portion of the aperture 36 intact, so that a downwardly projecting tongue 37 is created by the stamping process. When the SiP memory device 30 is inserted in the USB connector housing 22, this tongue 37 can push down on the upper surface 32 of the SiP memory device 30, thereby providing additional mechanical security between the USB connector housing 22 and the SiP memory device 30. Further, the apertures 36 can correspond to projections formed on an internal surface of the casing 40. These projections can latch into the aperture 36 to provide further engagement of the USB connector housing 22 with the casing 40.

The casing 40 and the USB connector housing 22 can be formed of different materials. Although a Standard A male USB connector is shown, it will be appreciated that another type of connector can be formed and employed. Further, although the platform chassis extension 25 is shown to extend substantially along the entire lengthwise of the casing 40, it will be appreciated that the length of the platform chassis extension 25 can be more than half of the length of the casing 40. The platform chassis extension 25 is to provide a rigid framework for the miniaturized memory storage assembly and the connector housing.

The chassis structure according to an embodiment of the present invention provides extended rigid framework to a miniaturized memory storage assembly such as SiP memory assembly. The chassis structure also prevents pivoting of the connector at an opening of a casing. The chassis structure extends from a connector housing of the connector. Further, the chassis structure can extend more than half lengthwise of a casing. The chassis structure also can include strengthening ribs along the lengthwise of the casing.

The thumb drive chassis structure according to an embodiment of the present invention supports a miniaturized memory storage package such as SiP memory package. The thumb drive chassis structure provides rigid framework in an ergonomically-sized casing despite the miniaturized size of the memory storage package. The thumb drive chassis can include a chassis structure within the casing with strengthening ribs along the lengthwise of the casing. The chassis structure can be integrally formed with a connector housing, which are partially exposed outside of the casing.

It will be apparent to those skilled in the art that various modifications and variations can be made in the chassis structure of embodiments of the invention without departing from the spirit or scope of the invention. Thus, it is intended that embodiments of the invention cover the modifications and variations of this invention provided they come within the scope of the appended claims and their equivalents.

What is claimed:

1. A memory device, comprising:
  a package housing, the package housing enclosing at least one memory and one memory controller, wherein the at least one memory and one memory controller are within the package housing;
  electrical contacts exposed at one end of the package housing, wherein the package housing includes projections on two side surfaces of the package housing; and
  a connector housing,
  wherein, the projections snap out from openings of the connector housing, when the package housing is inserted into the connector housing.

2. The device according to claim 1, wherein the package housing further includes a raised portion at a second end of the package housing, the raised portion of the package housing abuts against a connector housing when the package housing is to be placed within the connector housing.

3. The device according to claim 1, wherein the at least one memory and one memory controller are not exposed outside the package housing.

4. The device according to claim 1, wherein the package housing has a height that is larger than a height of the at least one memory and one memory controller.

5. The device according to claim 1,
  wherein the projections are flexible.

6. The device according to claim 1,
  wherein the projections include ramped surfaces.

7. The device according to claim 1, wherein the length of the package housing is substantially the same as the length of the connector housing.

8. The device according to claim 7, wherein the package has a height that is larger than a height of the at least one memory or the memory controller.

9. A system-in-package memory device, comprising:
  a package;
  at least one memory;
  one memory controller, the at least one memory and the memory controller enclosed in the package;
  electrical contacts exposed from a top surface of the package; and
  a latch projection at a first side surface of the package, the latch projection being flexible, wherein the latch projection for latching onto an opening of a connector housing when the package is to be inserted into the connector housing.

10. The device according to claim 9,
  wherein the electrical contacts are at a first end portion of the package, and
  wherein the package further includes a raised portion raising from the top surface of the package and at a second end portion of the package, the raised portion of the package abuts against a connector housing when the package is to be placed within the connector housing.

11. The device according to claim 9, wherein the at least one memory and the one memory controller are not exposed outside the package.

12. The device according to claim 9,
  wherein the latch projection includes a ramped surface.

13. The device according to claim 9, wherein the length of the package is substantially the same as the length of the connector housing.

14. The device according to claim 9, wherein the connector housing is formed of a conductive material.

15. The device according to claim 9, further comprising:
  a second latch projection at a second side surface of the package, the second latch projection being flexible, wherein the second latch projection for latching onto a second opening of a connector housing when the package is to be inserted into the connector housing.

16. The device according to claim 9, wherein the package has a bottom outside surface, which is substantially flat.

* * * * *